United States Patent [19]
Wanner

[11] Patent Number: 5,278,803
[45] Date of Patent: Jan. 11, 1994

[54] MEMORY COLUMN ADDRESS STROBE BUFFER AND SYNCHRONIZATION AND DATA LATCH INTERLOCK

[75] Inventor: Christopher C. Wanner, Houston, Tex.

[73] Assignee: Compaq Computer Corporation, Houston, Tex.

[21] Appl. No.: 757,541

[22] Filed: Sep. 11, 1991

[51] Int. Cl.$^5$ .............................................. G11C 7/00
[52] U.S. Cl. ............................... 365/233; 365/189.05; 365/189.08
[58] Field of Search .............. 365/233, 189.05, 230.08; 307/262, 279, 480

[56] References Cited

U.S. PATENT DOCUMENTS

| | | | |
|---|---|---|---|
| 4,922,458 | 5/1990 | Watanabe et al. | 365/189.05 |
| 5,057,711 | 10/1991 | Lee et al. | 365/189.05 |
| 5,073,872 | 12/1991 | Masuda et al. | 365/189.05 |
| 5,159,573 | 10/1992 | Yamada | 365/189.05 |

Primary Examiner—Eugene R. LaRoche
Assistant Examiner—Son Dinh
Attorney, Agent, or Firm—Pravel, Hewitt, Kimball & Krieger

[57] ABSTRACT

A buffer and synchronization circuit for a computer system which provides synchronization of the column address strobe (CAS) signals provided to the memory DRAMs and which interlocks the memory data latch enable with the CAS signals provided from the memory controller without adding extra clock cycles or wait states. A synchronized buffer circuit receives the CAS signals from the memory controller and provides a plurality of synchronized duplicate CAS signals to the memory DRAMs. The synchronized buffer circuit includes several gate drivers in a single semiconductor chip so that each of the drivers has approximately the same delay in order to minimize skew between the duplicated CAS signals. An interlocking buffer circuit receives the memory data latch enable signal and the CAS signals from the memory controller and provides a synchronized memory latch enable to the data buffers. The buffer and synchronization circuit according to the present invention interlocks the memory latch enable to the CAS signals so that the latch enable is not negated prematurely regardless of the premature negation of the memory data latch enable from the memory controller.

8 Claims, 4 Drawing Sheets

MEMORY COLUMN ADDRESS STROBE BUFFER AND SYNCHRONIZATION AND DATA LATCH INTERLOCK

BACKGROUND OF THE INVENTION

1. Field of the Invention

The present invention relates to a circuit for buffering and synchronizing the memory column address strobe (CAS) signals and interlocking the data latch with the CAS signals of a computer system.

2. Description of the Related Art

Modern computer systems are becoming more modularized wherein the different components or subsystems of the computer system are provided on separate and removable circuit boards, or modules, which are all coupled together through a main system or mother board. The mother board contains a plurality of connectors to provide an interconnection network between the components or subsystems that comprise the entire computer system. The vital subsystems which are traditionally located on the motherboard, such as main memory or the central processing unit (CPU) and supporting logic, are now being placed on the removable modules.

There are many reasons for and benefits of modularization of computer systems. The entire computer system is not taken out of service for a significant period of time due to the failure of any given subsystem since the faulty subsystem can be readily replaced without having to service the entire computer system. The module that contains the faulty subsystem is removed and replaced such that the computer system can be immediately placed back into service. Another benefit is that since many computer systems are designed for particular purposes or specific applications, a modularized computer system may be tailored or programmed to meet the needs of the specific application.

For example, some computer systems need more processing capability, such that more of the modules or subsystems comprise processors, while other computer systems need more memory or extended input/output (I/O) capability. Modularization allows an easier way to upgrade a given computer system. For example, a different processor subsystem can replace or supplement the existing processor subsystem, or a new memory board can supplement or replace the existing memory board to provide enhanced memory capability.

One problem that arises in complex computer systems, particularly modularized computers, is timing variances due to complicated signal traces and a plurality of connectors between a source and a receiver. As a result of the added complexity of modularization, for example, some signals are delayed longer relative to other signals, causing skew problems wherein signals arrive at different locations at different times. Timing requirements between two signals may be violated if one signal is skewed relative to another, resulting in invalid data and improper operation of a computer system.

Skew problems are especially difficult to prevent between the host and memory data buses. A memory controller, which is usually provided to facilitate transfer of data between buses, typically provides row and column address signals to memory comprising dynamic random access memory (DRAMs), as well as latch enable signals to latchable transceiver data bus buffers (BB) placed between the host data bus and the memory data bus. The data buffers provide isolation between the host and memory data buses and allow control of the direction of flow of information between the data buses. The row and column address signals, or strobes, should be synchronized with the latch enable signals to meet the timing requirements of the data buffers and the (DRAMs). In a modularized system, skew problems can arise between the latch enable signal provided to the data buffers and the column address strobe (CAS) signals provided to the DRAMs. If the latch enable signals are negated prematurely before set-up timing requirements to the bus buffers are met, it is very likely that invalid data will be latched into the data buffers, causing improper operation.

One possible solution to the skew problems which arise in computer systems is to slow the entire system down by adding a clock cycle or a wait state such that the critical signals remain valid for an extra clock state. This solution, however, is undesirable since there is a decrease in performance of the overall computer system. It is desirable, therefore, to provide a solution to the timing skew problems which arise in a complex computer system without slowing it down.

Memory is typically organized into a plurality of DRAMs wherein each bit of data and each DRAM is accessible through a column and a row address signal. In many computer systems, it is desirable that the memory controller provide a separate CAS signal for each byte of data on the data bus so that each byte of data is individually accessible. Typically, all the individual CAS signals from the memory controller are the same for a read operation. Each CAS signal involves a plurality of DRAM semiconductor chips so that the CAS signals must be duplicated and buffered to provide enough drive for each DRAM. The duplicated CAS signals provided to the DRAMs represent the same CAS signals and it is desirable that they be asserted and negated at substantially the same time to assure proper data latching. It is desirable that the duplicated CAS signals provided to the DRAMs are asserted as soon as possible with as little time delay from when the memory controller asserts the original CAS signal, and negated at approximately the same time as the memory latch enable signal provided to the data buffer is negated. Further, the latch enable must not be negated until the data has had time to become valid and meet the setup time of the bus buffer, which with 80 nsec DRAMs and the preferred bus buffer is approximately 28.5 nsec, worst case, from the falling edge of the CAS signal.

SUMMARY OF THE PRESENT INVENTION

The buffering and synchronization circuit of the present invention provides the necessary buffering of the CAS signals and the data latch enable signals, and also synchronizes and interlocks the data latch enable signal with the CAS signals to insure the required data setup time to the data bus buffers. A memory latch enable signal provided to the data buffers from the circuit of the present invention is asserted after the CAS signals and the memory data to host data latch enable from the memory controller are asserted. The memory data to host data latch enable from the memory controller may be negated prematurely due to skew problems, which would otherwise cause invalid data to be latched into the data buffers if provided directly to the data buffers. The memory latch enable signal provided by the buffering and synchronization circuit of the present invention, however, is not negated at least until CAS signals from the memory controller are negated, and at approximately the same time that the CAS signals to the DRAMs are negated. This assures that the set-up time of the data buffers are met so that valid data is latched therein.

Each of the CAS signals from the memory controller must be converted to a plurality of CAS signals provided to a corresponding plurality of DRAMs involved in each data read or write operation. The circuit of the present invention provides the proper buffering capability to split each CAS signal from the memory controller to a plurality of duplicate CAS signals to the DRAMs. The buffer gates used for this purpose are located in the same semiconductor chip so that the delay associated with each buffer is approximately the same, thereby eliminating as much skew as possible between the duplicated CAS signals.

The buffering gates are arranged in such a manner to provide only a single gate delay from the assertion of the original CAS signal from the memory controller to the assertion of the plurality of duplicate CAS signals to the DRAMs, so that the duplicate CAS signals are buffered and asserted as soon as possible. Also, after the negation of the original CAS signals from the memory controller, a double gate delay occurs before the negation of the plurality of duplicate CAS signals, and before the negation of the memory latch enable to the data buffer, to synchronize the duplicate CAS signals and the memory latch enable.

The circuit of the present invention, therefore, properly buffers and synchronizes the CAS signals from the memory controller to the DRAMs and interlocks the memory latch enable to the CAS signals to assure the required data setup time to the data buffer. Furthermore, the circuit of the present invention does not insert extra clock cycles or wait states.

BRIEF DESCRIPTION OF THE DRAWINGS

A better understanding of the present invention can be obtained with the following detailed description of the preferred embodiment is considered in conjunction with the following drawings, in which.

DETAILED DESCRIPTION OF THE PREFERRED EMBODIMENT

Figure 1:
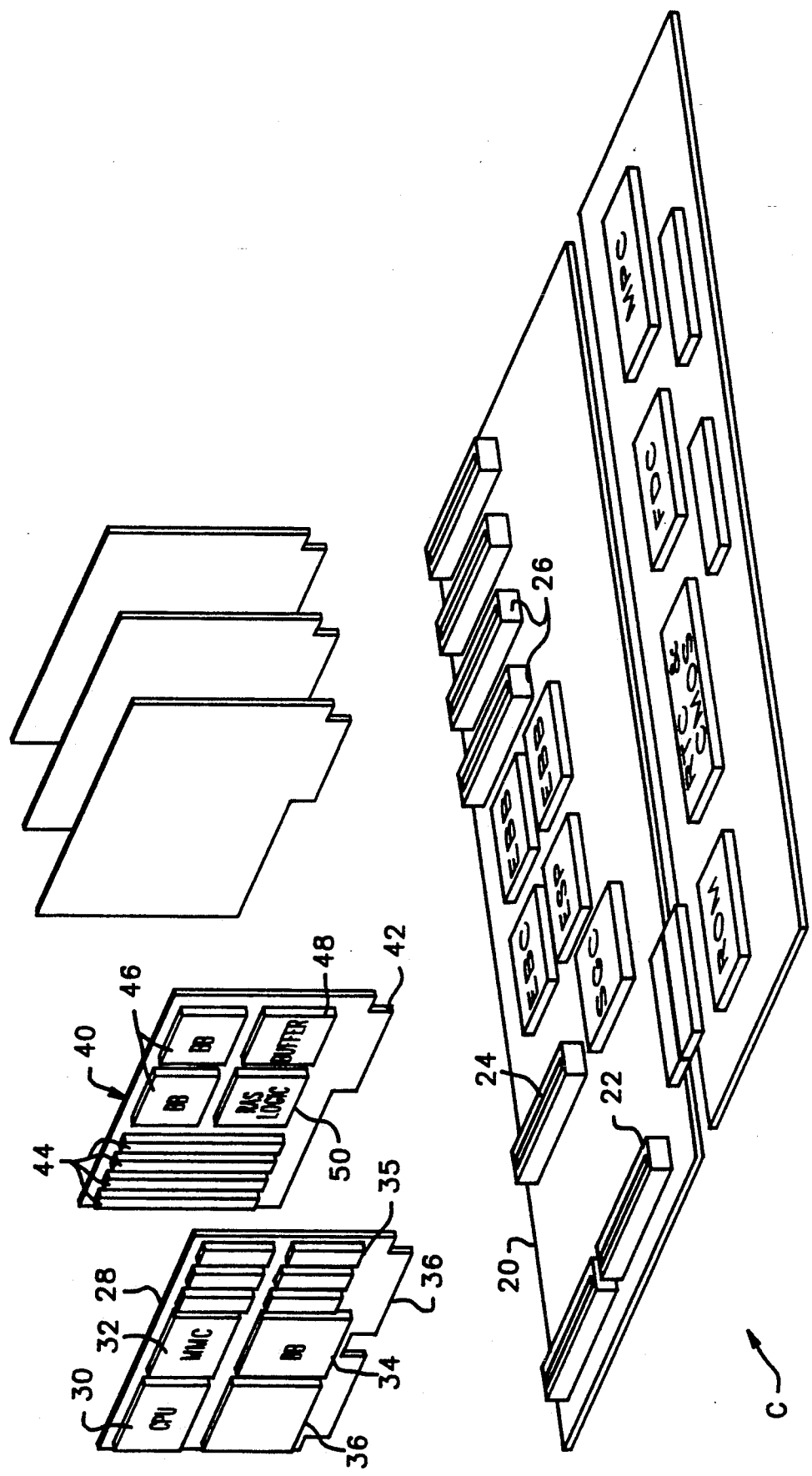
FIG. 1 is an exploded perspective view of a modularized computer system incorporating a buffering and synchronization circuit according to the present invention.

Referring now to FIG. 1, a computer system generally referred to by the letter C is shown which incorporates a buffer and synchronization circuit according to the present invention. The computer system C is preferably a modularized computer system which comprises a system board 20, connectors 22, 24 and a plurality of connectors 26 which are used to interconnect a plurality of subsystems of the computer system C through the system board 20. In one embodiment of a computer system C, for example, a separate and removable module 28 may include a central processing unit (CPU) 30 which is the main microprocessor of the computer system C. The module 28 includes a connector 36 which is adapted to connect to the connector 22 to couple the module 28 to the system board 20. The module 28 also includes a modularized memory controller (MMC) 32. The MMC 32 cooperates with a latchable transceiver data bus buffer (BB) 34 and local memory 35 so that the CPU 30 can access a minimum amount of memory without the need for a separate memory subsystem. The MMC 32 does provide sufficient signals to the connector 36 to allow control of a separate memory subsystem.

A separate memory subsystem is provided on a separate removable memory module 40 which includes a connector 42 adapted for connection to the connector 24 so that the memory module 40 may be coupled to the system board 20. The memory module 40 includes memory semiconductor chips 44 which are preferably dynamic random access memories (DRAMs) to provide additional memory for the computer system S. The DRAMs 44 are preferably single in-line memory modules (SIMMs) which are plugged into the memory module 40, such as the THM362500AS-80, the THM365120AS-80, the THM361020S-80, and the THM362020S-80 memory DRAMs manufactured by Toshiba. The memory module 40 includes its own latchable transceiver data bus buffers 46, other buffers 48 including the buffer and synchronization logic according to the present invention, and row address strobe (RAS) logic 50 which provide the logic to couple the DRAMs 44 to the other subsystems of the computer system S and particularly to the MMC 32.

Figure 2:
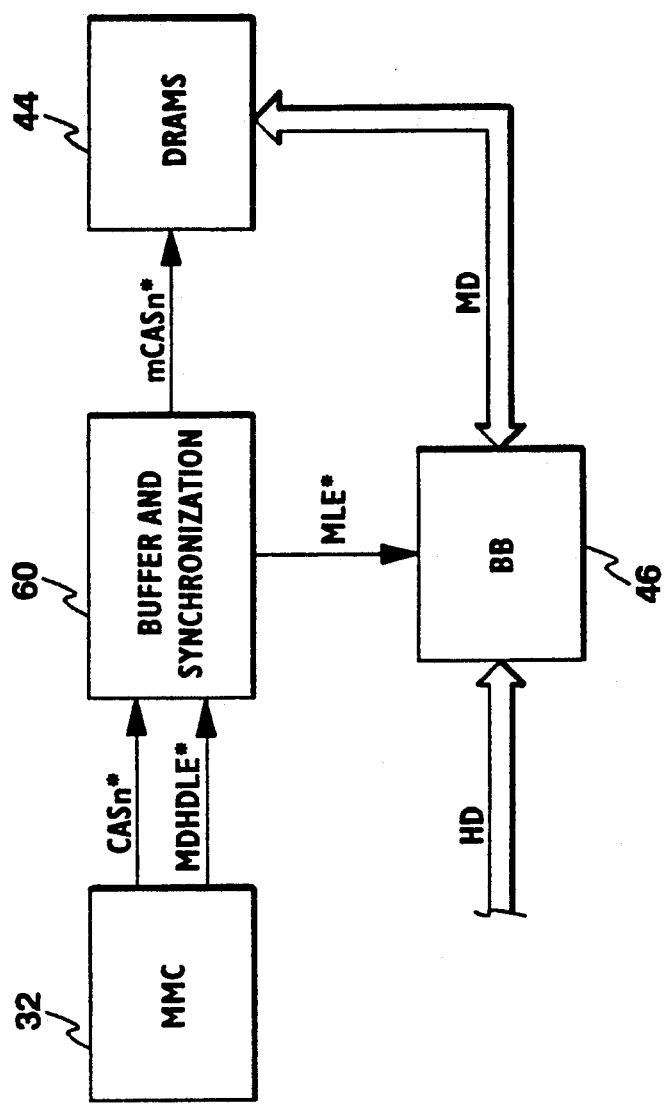
FIG. 2 is a schematic block diagram of a buffer and synchronization circuit according to the present invention coupled to the memory controller, memory and a latchable transceiver buffer of the computer system shown in FIG. 1.

Referring now to FIG. 2, a schematic block diagram of the memory controller or MMC 32, the DRAMs 44, the data bus buffer or BB 46 and a buffer and synchronization circuit 60 according to the present invention is shown. The host data bus, generally referred to by the letters HD, is coupled to one side of the BB 46 and the other side of the BB 46 is coupled to the memory data bus which is generally referred to by the letters MD. The BB 46 provides isolation between the HD bus and the MD bus and allows control of the data flow between the HD bus and the MD bus. The HD and MD buses typically comprise a plurality of data lines, wherein in the preferred embodiment of the computer system C, the HD and MD data buses are both 4 bytes wide. The HD data bus is provided to the CPU 30 and other data buses in the computer system C to allow cooperation with the DRAMs 44. The MMC 32 provides one or more column address strobe signals CASn*, wherein each of the CASn* signals are asserted low by the MMC 32 to enable the column addresses of the DRAMs 44. The asterisk "*" at the end of a signal name indicates negative logic wherein the signal is true or asserted when low and false or negated when high.

In the preferred embodiment of the computer system C, there is one CASn* signal corresponding to each of the 4 bytes of data on the HD and MD data buses, referred to as CAS0*, CAS1*, CAS2* and CAS3*. The CASn* signals are converted to a plurality of mCASn* signals which are directly provided to the DRAMs 44. Each of the CASn* signals are routed and provided to a plurality of DRAMs 44 so that a buffer is required to provide the mCASn* signals to the plurality of DRAMs 44. The MMC 32 also provides a memory data to host data latch enable signal, referred to as the MDHDLE* signal, which is intended to be used to latch data into the BB 46 from the MD bus to be provided to the HD bus. Data was originally intended to be latched into the BB 46 on the rising edge of the MDHDLE* signal, and the rising edge of the MDHDLE* should occur at approximately the same time as when the mCASn* signals are negated. Skew problems may exist in a complex computer system, such as the modularized computer system C, wherein the MDHDLE* signal is skewed relative to the CASn* signals provided to the DRAMs 44 due to the connectors 22, 24, 36, and 42, the traces on the system board 20 and the various device loadings. In this manner, the MDHDLE* signal can be negated prematurely with respect to the mCASn* signals such that the set-up timing requirements of the BB 46 are not met. Invalid data, therefore, would be latched into the BB 46 and provided to the HD data bus. For this reason, the MDHDLE* signal is not be provided directly to the BB 46.

The buffer and synchronization circuit 60 of the present invention is connected to the CASn* signals and the MDHDLE* signal from the MMC 32 and buffers the CASn* signals to provide the mCASn* signals to the DRAMs 44. The circuit 60 also provides a synchronized memory latch enable signal, referred to as the MLE* signal, to the BB 46. The MLE* signal is connected to the BB 46 rather than the MDHDLE* signal, and operates in a similar fashion wherein data is latched into the BB 46 on the rising edge of the MLE* signal. The buffering and synchronization circuit 60 provides the proper buffering and timing between the CASn* signals and the mCASn* signals to the DRAMs 44 and also interlocks and synchronizes the MLE* signal with the mCASn* signals so that the BB 46 can properly latch valid data from the MD data bus.

Figure 3:
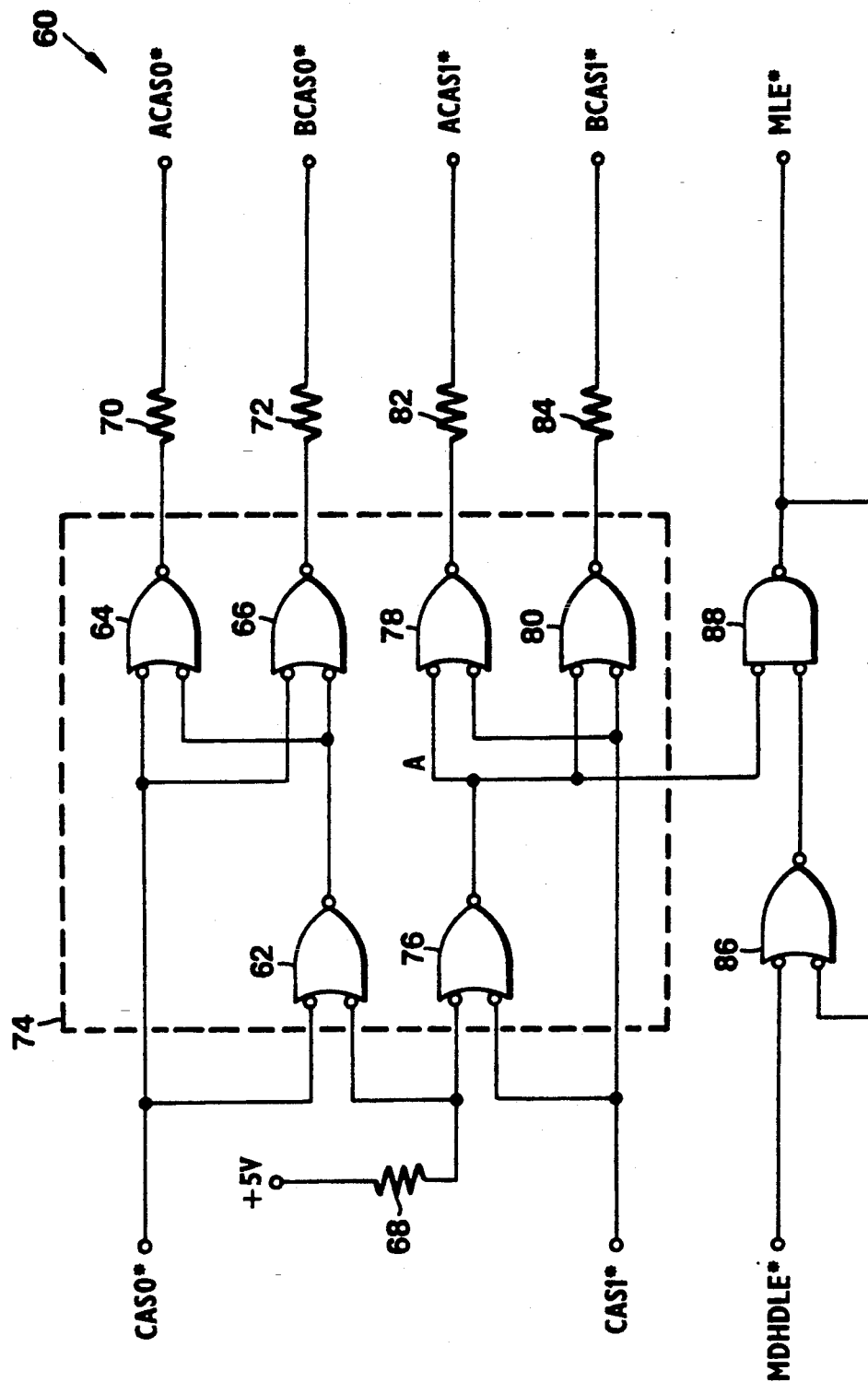
FIG. 3 is a schematic diagram of a buffer and synchronization circuit according to the present invention.

Referring now to FIG. 3, a schematic diagram of a portion of the buffer and synchronization circuit 60 according to the present invention is shown. The preferred embodiment includes 3 duplicate circuits of the buffer and synchronization circuit 60 shown in FIG. 3 to interface the CAS0* and CAS1* signals to an additional number of DRAMs 44 and to interface the CAS2* and CAS3* signals to provide the remaining mCASn* signals to an equal number of DRAMs 44. These duplicate circuits are not shown for purposes of simplification, since the circuit 60 illustrated in FIG. 3 is representative of the function of the buffer and synchronization circuit 60 according to the present invention.

The CAS0* signal is connected to one input of each of 3 two input AND gates 62, 64 and 66. The AND gates 62, 64 and 66 are preferably part of a single semiconductor chip driver 74, such as the 74AS808 hex 2 input AND drivers manufactured by Texas Instruments Incorporated (hereinafter TI) for reasons explained below. The output of the AND gate 62 is connected to the other input of each of the AND gates 64 and 66. One side of a pull-up resistor 68 is connected to a 5 volt source, referred to as a signal +5 V, and the other side of the resistor 68 is connected to the other input of the AND gate 62. The output of the AND gate 64 is connected to one side of a resistor 70 and the other side of the resistor 70 is a signal referred to as ACAS0*. The output of the AND gate 66 is similarly connected to one side of a resistor 72 and the other side of the resistor 72 is a signal referred to as BCAS0*.

When the CAS0* signal is asserted low, the ACAS0* signal is asserted low after a delay through the AND gate 64 and the BCAS0* signal is asserted low after a delay through the AND gate 66. The ACAS0* and BCAS0* signals are asserted low, therefore, after approximately one gate delay after the assertion of the CAS0* signal. Since the delay through the AND gates 64 and 66 are approximately the same since they are part of the same semiconductor driver 74, the ACAS0* and BCAS0* are asserted approximately at the same time in response to the assertion of the CAS0* signal. The ACAS0* and BCAS0* signals are each buffered versions of the CAS0* signal which are provided to separate DRAM chips within the DRAM memory 44. This provides very little skew between the ACAS0* and BCAS0* signals.

When the CAS0* signal is negated high, the ACAS0* and BCAS0* signals are negated after a delay through the AND gate 62 and then through the AND gates 64 and 66, respectively. The output of the AND gate 62 must rise from a low to high before the outputs of the AND gates 64 and 66 can rise from a low logic level, so that the negation of the ACAS0* and BCAS0* signals occurs after approximately two gate delays in response to the negation of the CAS0* signal. The ACAS0* and BCAS0* signals are negated high at approximately the same time.

The CAS1* signal is connected to one input of each of three AND gates 76, 78 and 80, respectively. The other input of the AND gate 76 is connected to the junction between the resistor 68 and one input of the AND gate 62. The output of the AND gate 76, referred to as a signal A, is connected to the other input of each of the AND gates 78 and 80. The AND gates 76, 78 and 80 are also preferably part of the semiconductor driver 74 including the AND gates 62, 64 and 66. The output of the AND gate 78 is connected to one side of a resistor 82 and the other side of the resistor 82 is a signal referred to as ACAS1*. The output of the AND gate 80 is connected to one side of resistor 84 and the other side of the resistor 84 is a signal referred to as BCAS1*.

The ACAS1* and BCAS1* signals are buffered versions of the CAS1* signal just as the ACAS0* and BCAS0* signals are buffered versions of the CAS0* signal. In this manner, the assertion of the CAS1* signal causes the assertion of the ACAS1* and BCAS1* signals after one gate delay through the AND gates 78 and 80, respectively. Also, the negation of the CAS1* signal causes the negation of the ACAS1* and BCAS1* signals after a first gate delay through the AND gate 76, and then a second gate delay through the AND gates 78 and 80, respectively. Since the AND gates 76, 78 and 80 are part of the same semiconductor driver 74 as the AND gates 62, 64 and 66, the delay from the CAS0* signal to the ACAS* and BCAS0* signals are approximately the same as the delay from the CAS1* signal to the ACAS1* and BCAS1* signals.

The MDHDLE* signal is connected to one input of a two input AND gate 86. The AND gate 86 is preferably a 74F08 two-input AND gate, manufactured by TI. The output of the AND gate 86 is connected to one input of a two input OR gate 88. The OR gate 88 is preferably a 74F32 two input positive OR gate, also manufactured by TI, such that it has approximately the same delay as the AND gate 80. This provides synchronization between the MLE* signal and the mCASn* signals, as further described below. The A signal developed by the AND gate 76 is connected to the other input of the OR gate 88, and the output of the OR gate 88 is the memory latch enable signal referred to as MLE*. The MLE* signal is connected to the other input of the AND gate 86. As will be more fully described below, the addition of the AND gate 86 and the OR gate 88 provide a synchronization and interlocking mechanism of the MLE* signal to the BCAS1* signal to assure proper data setup time to the BB 46.

Figure 4:
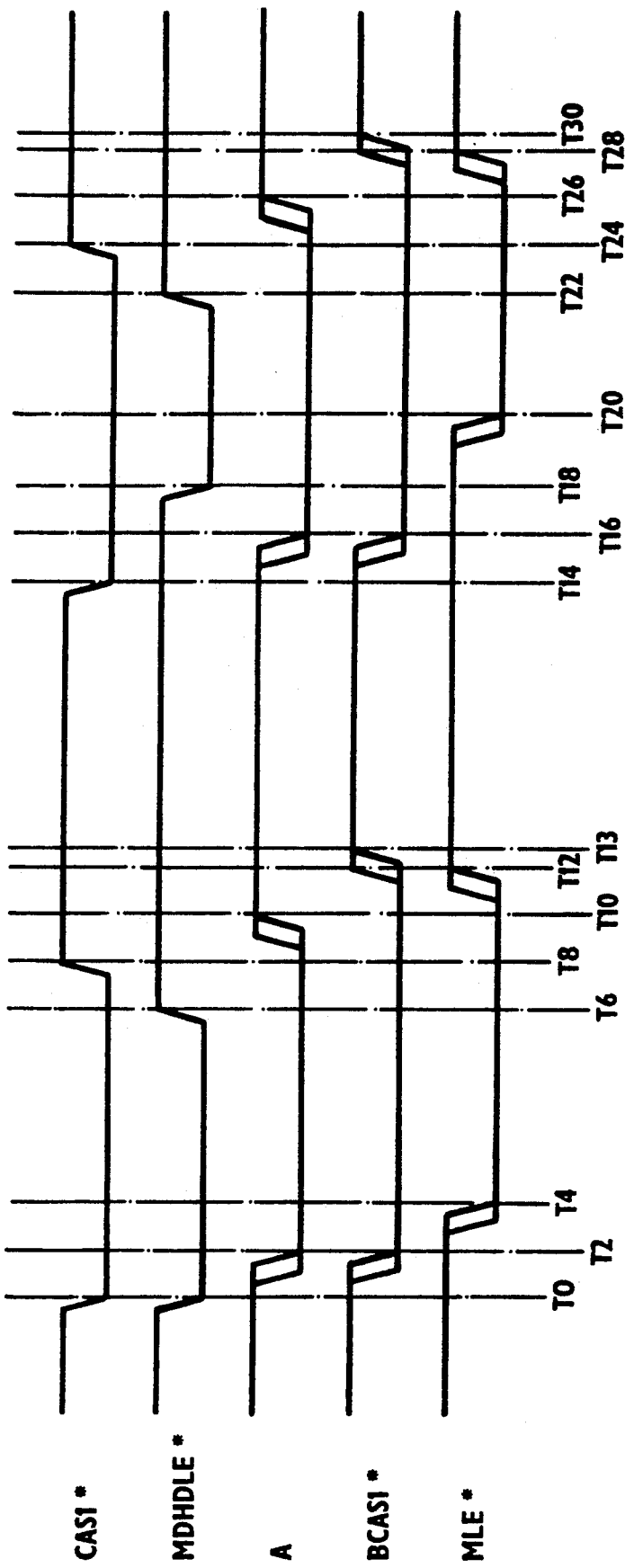
FIG. 4 is a timing diagram illustrating the operation of the buffer and synchronization circuit of FIG. 3.

Referring now to FIG. 4, a timing diagram of the buffer and synchronization circuit 60 of the present invention is shown. The CAS1* signal is plotted and represents the CAS0* signal also, since both of these signals are preferably asserted and negated at approximately the same time if the corresponding bytes of data are both being read or written concurrently. The MDHDLE* signal is plotted as well as the intermediate signal A and the BCAS1* and MLE* signals. The BCAS1* signal represents the ACAS0*, the BCAS0* and the ACAS1* signals since these signals are asserted at approximately the same time since the gate delays through the AND gates 62–66 and 76–80 are approximately the same. The CAS1* and MDHDLE* signals are initially negated high so that the A, BCAS1* and MLE* signals are also negated high. At a time T0, the CAS1* and MDHDLE* signals are asserted low by the MMC 32. The A signal falls from high to low in response to the assertion of the CAS1* signal at a time T2, wherein the time T2 is subsequent to the time T0 after the delay through the AND gate 76. The BCAS1* signal is also asserted low at approximately the time T2 in response to the assertion of the CAS1* signal low since the delay through the AND gate 80 is approximately the same as the delay through the AND gate 76. Thus, the BCAS0* signal is asserted after only one gate delay after the assertion of the CAS1* signal.

The assertion of the MDHDLE* signal low causes the output of the AND gate 86 to also fall to a low level. Thus, the MLE* signal is asserted low in response to the falling edge of the A signal at a time T4, wherein the time T4 is subsequent to the time T2 by the gate delay through the OR gate 88. Thereafter, at a time T6, the MDHDLE* signal is negated high while the CAS1* signal is still asserted low. However, since the MLE* signal is asserted low at the time T6, the output of the AND gate 86 remains low so that the MLE* signal also remains asserted low and is not negated high in response to the negation of the MDHDLE* signal. The CAS1* signal is then received negated high from the MMC 32 at a time T8. While the MMC 32 preferably negates the CAS1* and MDHDLE* signals at approximately the same, skew problems may result in this later arrival of the CAS1* signal, the problem of interest and so shown in the illustration. The A signal rises at a time T10 in response to the negation of the CAS1* signal, wherein the time T10 is subsequent to the time T8 by the gate delay through the AND gate 76. The MLE* signal is negated high at a time T12 in response to the rising edge of the A signal, wherein the time T12 is subsequent to the time T10 by the gate delay through the OR gate 88.

The BCAS1* signal is negated high in response to the rising edge of the A signal at a time T13, which is subsequent to the time T10 by the delay through the AND gate 80. The delay through the AND gate 80 and the OR gate 88 are approximately the same, such that the MLE* signal is synchronized with the BCAS1* signal and so that the time T13 is approximately the same as the time T12, though shown exaggerated for clarity in the illustration. Although the delay through the gates 80 and 88 may differ only slightly, the capacitive loading of the DRAMs 44 may cause the BCAS1* signal to rise more slowly than the MLE* signal. In any event, the MLE* signal is not negated prematurely in response to the premature negation of the MDHDLE* signal, but is kept asserted low until after the CAS1* signal is negated high. Furthermore, the MLE* signal is substantially synchronized with the BCAS1* signal. Since the MLE* signal is provided to the buffer BB 46 rather than the MDHDLE* signal, the data setup time of the BB 46 is met, thereby allowing the BB 46 to latch in valid data from the MD data bus.

In a subsequent cycle, the CAS1* signal is asserted low by the MMC 32 at a time T14. The A signal goes low at a time T16 in response to the assertion of the CAS1* signal low, wherein the time T16 is subsequent to the time T14 by the delay through the AND gate 76. Also, the BCAS1* signal is asserted low at approximately the time T16 in response to the assertion of the CAS1* signal after a single gate delay through the AND gate 80. At a time T18, the MDHDLE* signal is asserted low while the CAS1* signal is still asserted low causing the MLE* signal to be asserted low at a time T20, wherein the time T20 is subsequent to the time T18 by a delay through the AND gate 86 plus a delay through the OR gate 88. Note that the MLE* signal is not asserted low in response to the CAS1* signal being asserted low since the MDHDLE* signal was not yet asserted low.

Thereafter, the MDHDLE* signal is negated high prematurely at a time T22 while the CAS1* signal is still asserted low. Since the MLE* signal is also asserted low at the time T22, the output of the AND gate 86 remains low regardless of the status of the MDHDLE* signal so that MLE* signal does not rise prematurely in response to the premature negation of the MDHDLE* signal. Subsequently, at a time T24, the CAS1* signal is negated high, which causes the A signal to be negated high at a time T26, wherein the time T26 is subsequent to the time T24 by the delay through the AND gate 76. The negation of the A signal high causes the MLE* signal to be negated high at a time T28 wherein the time T28 is subsequent to the time T26 by the delay through the OR gate 88. The BCAS1* signal is negated high at a time T30, wherein the time T30 is subsequent to the time T26 by the delay through the AND gate 80, plus additional delay due to the capacitive loading of the DRAMs 44. In spite of the additional delay time due to the capacitive loading, there is very little time difference between the times T28 and T30. As in the previous cycle, the MLE* signal is prevented from being negated high prematurely by the MDHDLE* signal so that the MLE* signal remains asserted low until after the CAS1* signal is negated high. Also, the MLE* signal is negated at approximately the same time as the negation of the BCAS1* signal.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

I claim:

1. A buffer and synchronization circuit for use with dynamic memory column address strobe (CAS) signals, comprising:

a first, a second and a third buffer on a single semiconductor chip such that said first, second and third buffers each have substantially the same delay, said first and second buffers each having a first input for receiving a first input CAS signal and a second input, and an output for providing a first and a second output CAS signal, respectively, and said third buffer having an input coupled to said first input CAS signal and an output coupled to said second inputs of said first and second buffers;

wherein when said first input CAS signal is asserted, said first and second output CAS signals are asserted at substantially the same time after a delay through said first and second buffers, respectively, and wherein when said first input CAS signal is negated, said first and second output CAS signals are negated at substantially the same time after a first buffer delay through said third buffer added to a second buffer delay through said first and second buffers, respectively.

2. The circuit of claim 1, further comprising a fourth, a fifth and sixth buffer on said single semiconductor chip such that said fourth, fifth and sixth buffers each have substantially the same delay as said first, second and third buffers, said fourth and fifth buffers each having a first input for receiving a second input CAS signal and a second input, and an output for providing a third and a fourth output CAS signal respectively, and said sixth buffer having an input coupled to said second input CAS signal and an output coupled to said second inputs of said fourth and fifth buffers;

wherein when said second input CAS signal is asserted, said third and fourth output CAS signals are asserted at substantially the same time after a delay through said fourth and fifth buffers, respectively, and wherein when said second input CAS signal is negated, said third and fourth CAS signals are negated at substantially the same time after a first buffer delay through said sixth buffer in addition to a second buffer delay through said fourth and fifth buffers, respectively.

3. The circuit of claim 1 for further use with a memory data latching signal, further comprising:

means having an input coupled to an input latch enable signal, an input coupled to said third buffer output and an output for providing an output latch enable signal, wherein said output latch enable signal is asserted after said first input CAS signal and said input latch enable signal are both asserted, and wherein said output latch enable signal is negated at approximately the same time as said first and second output CAS signals are negated.

4. The circuit of claim 3, wherein said providing means includes a fourth buffer having a first input connected to said output of said third buffer, a second input coupled to said input latch enable signal and an output providing said output latch enable signal, wherein the delay through said fourth buffer is substantially the same as the delay through said first and second buffers.

5. The circuit of claim 4, wherein said providing means includes a fifth buffer having an input connected to said input latch enable signal, an input connected to said output latch enable signal and an output connected to said second input of said fourth buffer.

6. The circuit of claim 5, wherein said first, second, third and fifth buffers are AND gates and said fourth buffer is an OR gate.

7. The circuit of claim 4, wherein said first, second and third buffers are AND gates and said fourth buffer is an OR gate.

8. The circuit of claim 1, wherein said first, second and third buffers are AND gates.

* * * * *